United States Patent
Clark et al.

(10) Patent No.: US 12,376,246 B2
(45) Date of Patent: Jul. 29, 2025

(54) LATCH ASSEMBLIES FOR DATA PROCESSING SYSTEMS

(71) Applicant: Dell Products L.P., Round Rock, TX (US)

(72) Inventors: Peter Timothy Clark, Taipei (TW); Matthew Bryan Gilbert, Bend, OR (US); Richard William Guzman, Lago Vista, TX (US); Sean P. O'Donnell, Poughkeepsie, NY (US)

(73) Assignee: Dell Products L.P., Round Rock, TX (US)

( * ) Notice: Subject to any disclaimer, the term of this patent is extended or adjusted under 35 U.S.C. 154(b) by 186 days.

(21) Appl. No.: 18/496,201

(22) Filed: Oct. 27, 2023

(65) Prior Publication Data

US 2025/0142747 A1    May 1, 2025

(51) Int. Cl.
 *H05K 5/02*    (2006.01)
(52) U.S. Cl.
 CPC .................... *H05K 5/0221* (2013.01)
(58) Field of Classification Search
 None
 See application file for complete search history.

(56) References Cited

U.S. PATENT DOCUMENTS

| | | | | |
|---|---|---|---|---|
| 6,181,549 B1 * | 1/2001 | Mills | ..................... | H05K 7/1489 292/228 |
| 6,547,289 B1 * | 4/2003 | Greenheck | ................ | E05B 65/46 292/200 |
| 6,579,029 B1 * | 6/2003 | Sevde | .................. | H05K 7/1414 403/321 |
| 7,002,799 B2 | 2/2006 | Malone et al. | | |
| 8,941,993 B2 | 1/2015 | Eckberg et al. | | |
| 9,609,778 B1 * | 3/2017 | Spencer | ................... | G06F 1/183 |
| 9,723,756 B1 * | 8/2017 | Masters | ............... | H05K 7/1489 |
| 9,795,052 B2 * | 10/2017 | Hsiao | ....................... | H05K 7/18 |
| 10,070,549 B2 * | 9/2018 | Su | ......................... | H05K 7/1409 |
| 10,499,527 B2 * | 12/2019 | Liao | ...................... | H05K 7/1489 |
| 10,563,429 B1 * | 2/2020 | Bailey | ................... | E05B 35/008 |
| 10,584,514 B2 * | 3/2020 | Leong | ................ | E05B 47/0657 |
| 10,681,835 B2 * | 6/2020 | Moore | ................ | H05K 7/1492 |
| 11,330,728 B2 * | 5/2022 | Ye | .......................... | H05K 5/023 |
| 11,419,224 B1 * | 8/2022 | Wang | ................... | H05K 7/1487 |
| 2002/0182896 A1 * | 12/2002 | Welsh | ................. | H05K 7/1409 439/1 |

(Continued)

*Primary Examiner* — Xanthia C Relford
(74) *Attorney, Agent, or Firm* — WOMBLE BOND DICKINSON (US) LLP

(57) ABSTRACT

Devices, systems, and methods for managing chassis of data processing systems are disclosed. The chassis may be managed by reversibly attaching them to structural members such as rails. When so attached, the chassis may be fixedly held in a position. To facilitate access to an interior of the chassis, the chassis may be detached from the structural member and moved to a maintenance position. To detach the chassis from the structural member, the chassis may include a latch. The latch may be positioned in an ear of the chassis and may be protected by a frame. The frame may include a recess, hole, or other feature to facilitate access to the latch. The access may allow application of force to a single portion of the latch to rotate or otherwise actuate the latch. Actuation of the latch may facilitate detachment of the chassis from the structural member.

20 Claims, 14 Drawing Sheets

(56) References Cited

U.S. PATENT DOCUMENTS

| | | | |
|---|---|---|---|
| 2006/0053599 A1* | 3/2006 | Chang | F16B 2/10 24/455 |
| 2006/0215373 A1* | 9/2006 | Joist | H05K 7/1409 361/726 |
| 2007/0240463 A1* | 10/2007 | Antonucci | E05B 13/002 70/208 |
| 2009/0181568 A1* | 7/2009 | Chiang | H05K 7/1409 439/310 |
| 2013/0018505 A1* | 1/2013 | Barrett | A61G 12/001 221/277 |
| 2013/0098123 A1* | 4/2013 | Gorontzi | G05G 5/28 70/201 |
| 2013/0241377 A1* | 9/2013 | Zhang | G06F 1/181 403/188 |
| 2014/0352223 A1* | 12/2014 | Le | E05B 17/002 292/307 R |
| 2015/0327389 A1* | 11/2015 | Westphall | H01R 13/62988 361/748 |
| 2016/0150659 A1* | 5/2016 | Chen | E05B 65/46 292/126 |
| 2017/0048992 A1* | 2/2017 | Katsaros | H05K 7/16 |
| 2017/0150634 A1* | 5/2017 | Huang | H05K 7/1489 |

* cited by examiner

LATCH ASSEMBLIES FOR DATA PROCESSING SYSTEMS

FIELD OF THE DISCLOSURE

Embodiments disclosed herein generally relate to a device management. More particularly, embodiments disclosed herein relate to systems and methods to manage chassis.

BACKGROUND

Computing devices may provide various types of computer implemented services. To provide the computer-implemented services, computing devices may include various type of hardware devices such as, for example, processors, memory modules, and storage devices. These hardware components may need to be positioned with one another to provide their respective functions. Similarly, various components devices may be aggregated together to form a computing system.

BRIEF DESCRIPTION OF THE DRAWINGS

Embodiments disclosed herein are illustrated by way of example and not limitation in the figures of the accompanying drawings in which like references indicate similar elements.

FIGS. 2A-2K show diagrams illustrating a chassis and components thereof in accordance with an embodiment.

DETAILED DESCRIPTION

Figure 1:
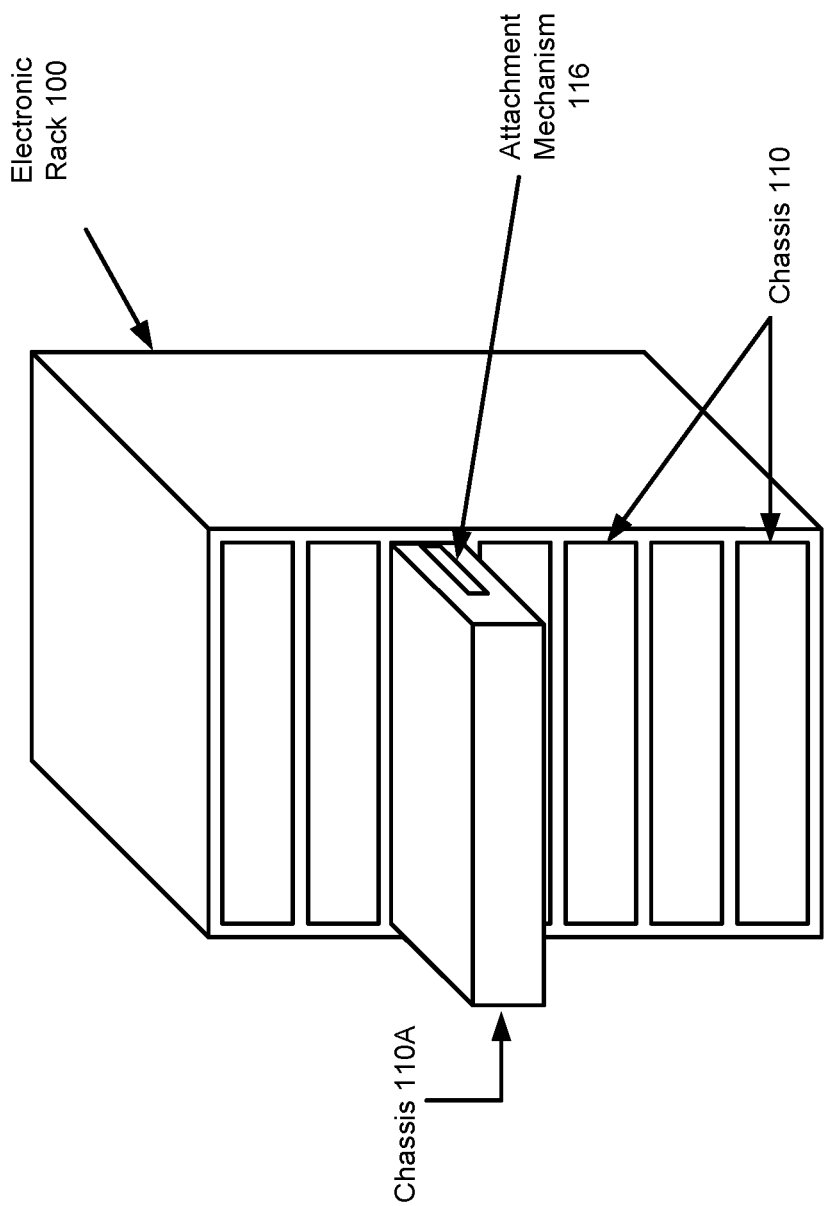
FIG. 1 shows a diagram illustrating an electronic rack in accordance with an embodiment.

Various embodiments will be described with reference to details discussed below, and the accompanying drawings will illustrate the various embodiments. The following description and drawings are illustrative of the embodiment disclosed herein and are not to be construed as limiting the disclosed embodiments. Numerous specific details are described to provide a thorough understanding of various embodiments. However, in certain instances, well-known or conventional details are not described in order to provide a concise discussion of embodiments disclosed herein.

Reference in the specification to "one embodiment" or "an embodiment" means that a particular feature, structure, or characteristic described in conjunction with the embodiment can be included in at least one embodiment disclosed herein. The appearances of the phrases "in one embodiment", "an embodiment", and similar recitations in various places in the specification do not necessarily all refer to the same embodiment.

In general, embodiments disclosed herein relate to devices, systems, and methods for managing chassis of data processing system. The chassis may be managed by reversibly attaching them to structural members such as rails. When so attached, the chassis may be fixedly held in a position.

To facilitate access to an interior of the chassis, the chassis may be detached from the structural member and moved to a maintenance position (e.g., rolled out of an electronic rack to remove a top cover to access hardware components in the chassis). To detach the chassis from the structural member, the chassis may include a latch.

The latch may be positioned in an ear of the chassis and may be protected by a frame. The frame may include a recess, hole, or other feature to facilitate access to the latch. The access may allow application of force to a single portion of the latch to rotate or otherwise actuate the latch. Actuation of the latch may facilitate detachment of the chassis from the structural member.

By doing so, the limited front side real estate of the chassis may be dedicated toward other purposes by reducing a width of the latch while enabling the latch to be actuated without needing to apply forces to other portions of the latch.

In an embodiment, a data processing system is disclosed. The data processing system may include a chassis to house hardware components; an ear of the chassis, the ear of the chassis comprising: a reserved area, and a latch area; a latch assembly, comprising: a latch positioned in the latch area and coupled to a securing mechanism that facilitates reversible attachment of the chassis to a rail system, the latch comprising: a force receiving portion, and a force application portion to selectively drive the securing mechanism; and a frame that restricts physical access to the latch, the frame comprising: a wall positioned to restrict access to at least a portion of the latch, and a recess positioned in the wall that exposes the force receiving portion while the latch is in an at rest position.

The latch may also include an additional force receiving portion that is not enclosed by the frame while the latch is in the at rest position.

The additional force receiving portion may include a ramp.

The data processing system may also include a pivot coupled to the latch, the pivot causing the latch to rotate from the at rest position to a second position while force is applied to the force receiving portion and to rotate from the second position to a third position while second force is applied to the additional force receiving portion.

While in the second position, the force receiving portion may be further exposed when compared to a level of exposure while in the at rest position, and the further exposure of the force receiving portion may facilitate a higher level of force application to the force receiving portion when compared to a level of force application facilitated by the level of exposure while in the at rest position.

The latch may also include a pivot; and a lever coupled to the pivot to cause the lever to rotate about the pivot while a force is applied to the force application portion.

The wall may include an edge aligned, while the latch is in the at rest position, with at least a portion of the lever to restrict physical access to the at least the portion of the lever.

When lever is rotated to move the latch to a second position, the at least the portion of the lever may move with respect to the wall exposing the at least the portion of the lever The wall may be parallel to a plane in which the lever moves while the lever is rotated.

While in the at rest position, a top of the latch may be substantially aligned with a front side of the chassis, the front side of the chassis being bound by at least four walls, and edges of the walls may be in a plane to which the top of the latch is substantially aligned.

In an embodiment, a chassis is provided, as discussed above.

In an embodiment, a latch assembly is provided, as discussed above.

Turning to FIG. 1, a diagram illustrating electronic rack 100 in accordance with an embodiment is shown. Electronic rack 100 may be used to store computing devices in one or more chassis 110. Chassis 110 may be physical devices for housing components such as computing devices.

In FIG. 1 and throughout, an example chassis is shown that conforms to a particular form factor (e.g., rack mount). However, it will be appreciated that embodiments disclosed herein may be used with respect to chassis that conform to other form factors without departing from the embodiments.

The computing device housed in chassis 110A may include one or more components. The component may include, for example, hardware devices that may varying in shape, performance, functionality, and/or other characteristics. The hardware devices may include one or more of the following types of hardware components: (i) memory modules such as random access memory (RAM), (ii) processing devices such as a central processing unit (CPU), (iii) storage devices such as hard disk drives, solid state drives, etc., (iv) input and output (I/O) devices, and/or (v) other types of hardware devices that may aid in providing computer implemented services.

One or more of chassis 110, such as chassis 110A, within electronic rack 100 may include an attachment mechanism (e.g., 116). Attachment mechanism 116 may include sliders or other physical structures for attaching a chassis to electronic rack 100. The attachment mechanism may also allow for the chassis to move within a limited range with respect to electronic rack 100. For example, the chassis may move into and/or out of electronic rack 100.

Figure 2A:
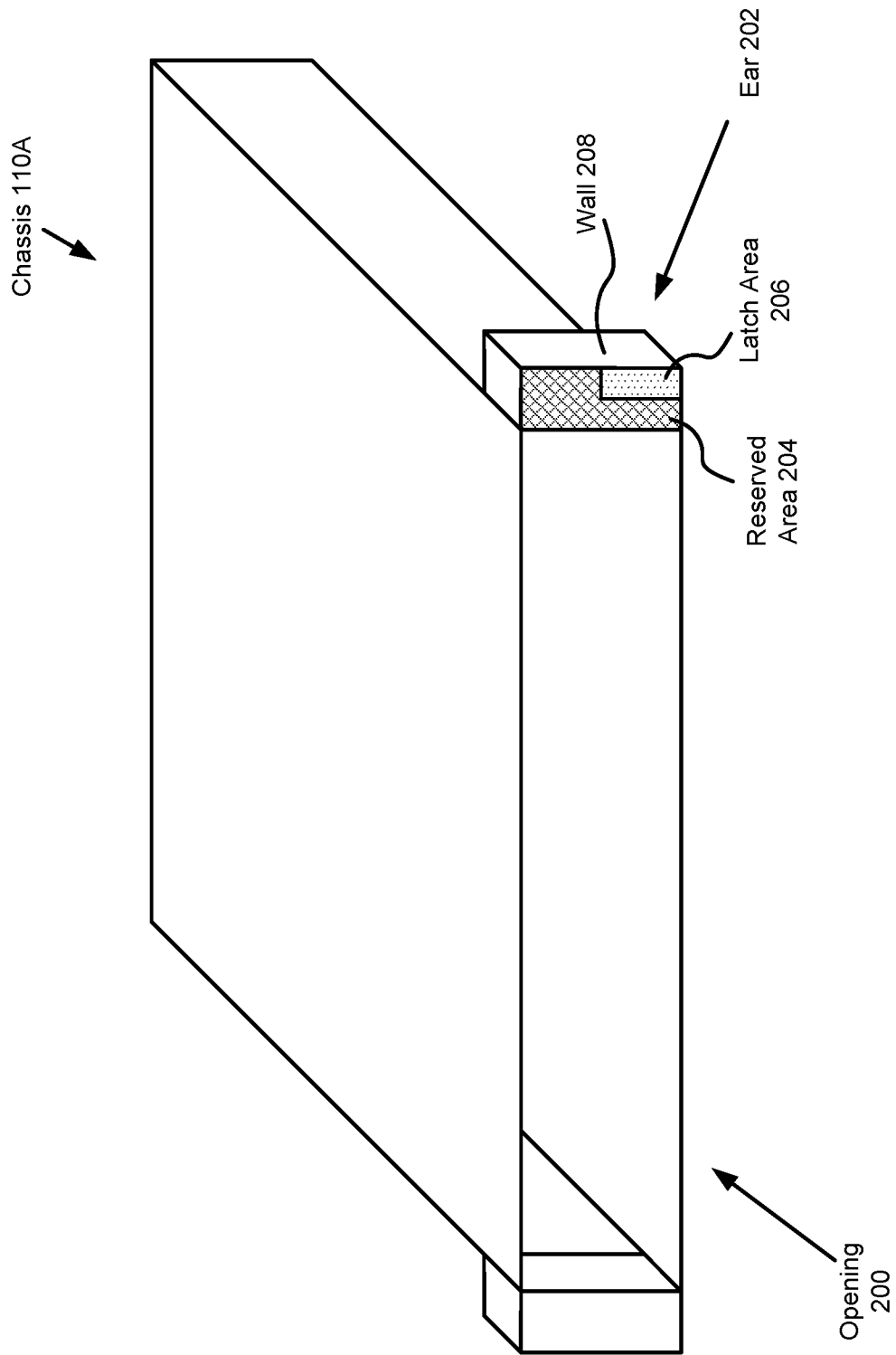

The movement of chassis 110 may be constrained by rails and/or other types of mechanisms for fixing the position of chassis 110 in place at least temporarily. For example, while operating chassis 110A may be moved to a first position and fixed in place. However, to perform maintenance on and/or for other reasons, chassis 110A may be released and moved (e.g., rolled out). Refer to FIG. 2A for additional information regarding fixing chassis 100A in place.

In FIG. 1, chassis 110A is illustrated in a first position (e.g., after sliding out of electronic rack 100), while other chassis are illustrated in a second position (e.g., after sliding into electronic rack 100). The second position may be the position in which the data processing system housed in the chassis are operated.

Electronic rack 100 may include openings and/or corresponding attachment points for attachment mechanisms of chassis 110 to stack any number of chassis 110 with respect to one another. The openings and/or attachment points may be positioned based on the dimensions of chassis 110

While illustrated in FIG. 1 with respect to a limited number of specific components in specific positions and orientations, an electronic rack may include different number and/or types of components with different positions and/or orientations without departing from embodiments disclosed herein.

Turning to FIG. 2A, a first diagram of chassis 110A in accordance with an embodiment is shown. Chassis 110A may include one or more openings (e.g., 200). These openings may allow gasses to flow through the interior of chassis 110A. The flow of gasses may be regulated, and used to thermally manage the hardware components within chassis 110A.

For example, during operation of a data processing system, hardware components of the data processing system may consume power and generate heat. To manage the heat, gasses may flow into or out of opening 200. The flow of gasses may carry the generated heat outside of chassis 110A.

To facilitate fixed attachment of chassis 110A to attachment mechanisms (e.g., rails), chassis 110A may include ears (e.g., 202). An ear of chassis 110A may be a lateral extension towards a front of the chassis. The ear may not be in line with the interior of chassis 110A thereby not obstructing access to hardware components within chassis 110A.

To facilitate reversible attachment of chassis 110A to attachment mechanisms, a latch (not shown) may be positioned with ear 202. The latch may be actuated by a person to disconnect the chassis from the attachment mechanism. Refer to FIGS. 2J-2K for additional details regarding disconnecting the chassis from the attachment mechanism (e.g., rail XXX).

To improve the amount of front side real estate of chassis 110A available for use for purposes other than for detachment of the chassis from the attachment mechanism, the front side area of the chassis may be allocated for different purposes.

For example, some reserved area 204 may be reserved for purposes other than for housing the latch. Reserved area 204 may be reserved for housing indicator lights, display components, and/or for other purposes. Consequently, a size of latch area 206 may be only a portion of the front area of the ear.

However, reducing the size of latch area 206 may limit the ability of a person to manipulate a latch in this area. For example, ear 202 may include one or more walls (e.g., 208) that enclose at least a portion of the latch thereby limiting access to the latch. These physical access limits imposed by wall 208 may reduce the ability of the latch to be actuated by a person (e.g., a service technician).

In general, embodiments disclosed herein relate to methods, systems, and devices for facilitating reversible attachment of chassis to attachment mechanisms. To facilitate the reversible attachment, a data processing system may include a latch assembly. The latch assembly may facilitate actuation of a latch by providing access to for receiving surface of the latch. The access may be provided, for example, by recessing portions of wall 208. The recessed portions of wall 208 may allow a person to gain access to the force receiving surface of the latch (e.g., that otherwise would not be accessible without the recessed portions.

By doing so, embodiments disclosed herein may provide a data processing system that may facilitate used of the front area of ears of chassis for other purposes while enabling disconnecting of the chassis from attachment mechanisms. Thus, embodiments disclosed herein may provide a data processing system with improved usability by increased the number of functionalities of the data processing system for a same given quantity of real estate.

Figure 2B:
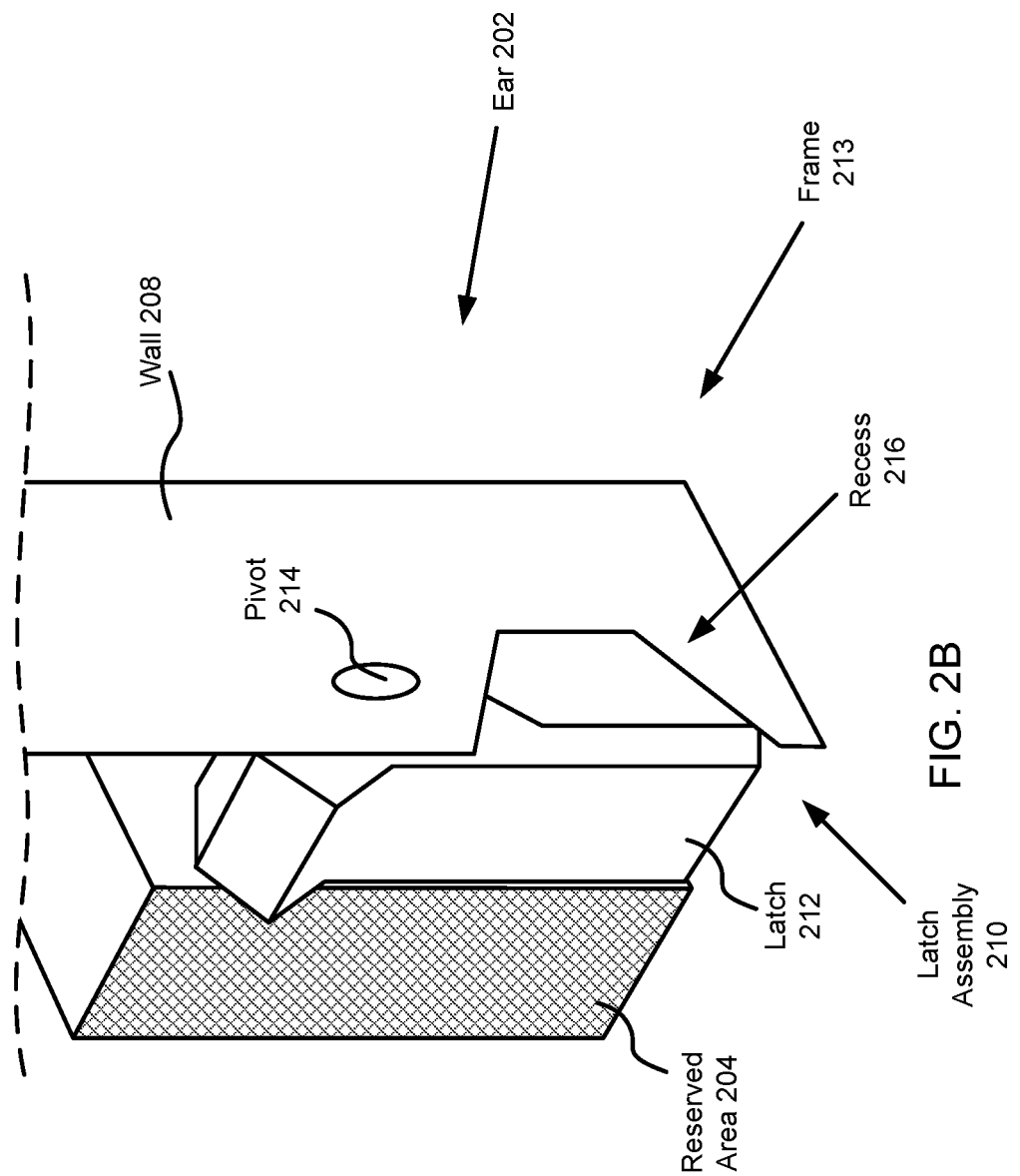
Figure 2C:
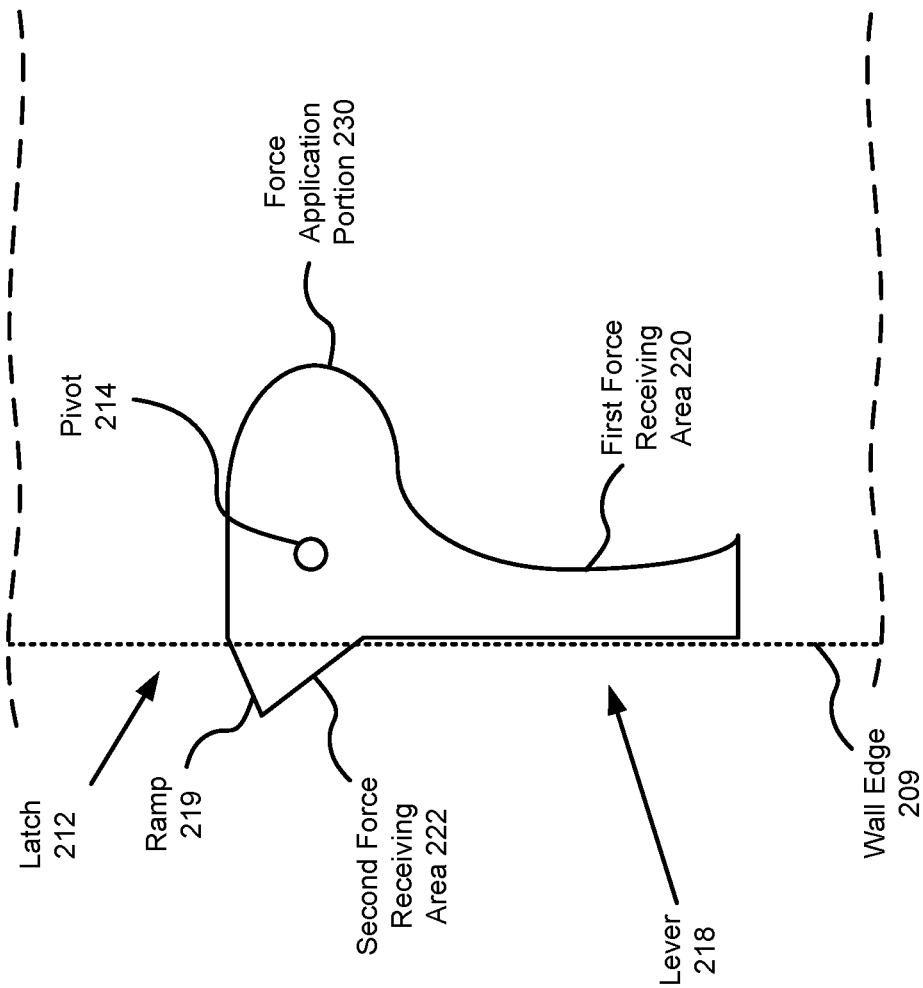
Figure 2D:
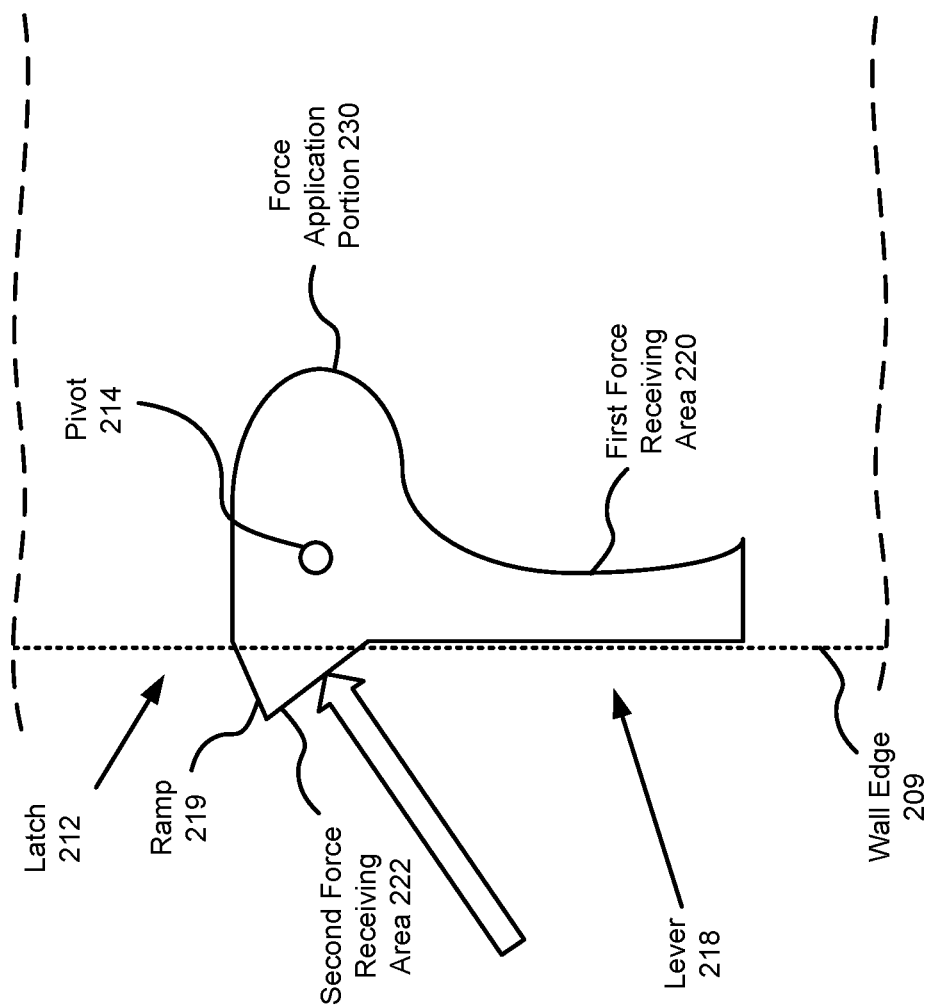
Figure 2E:
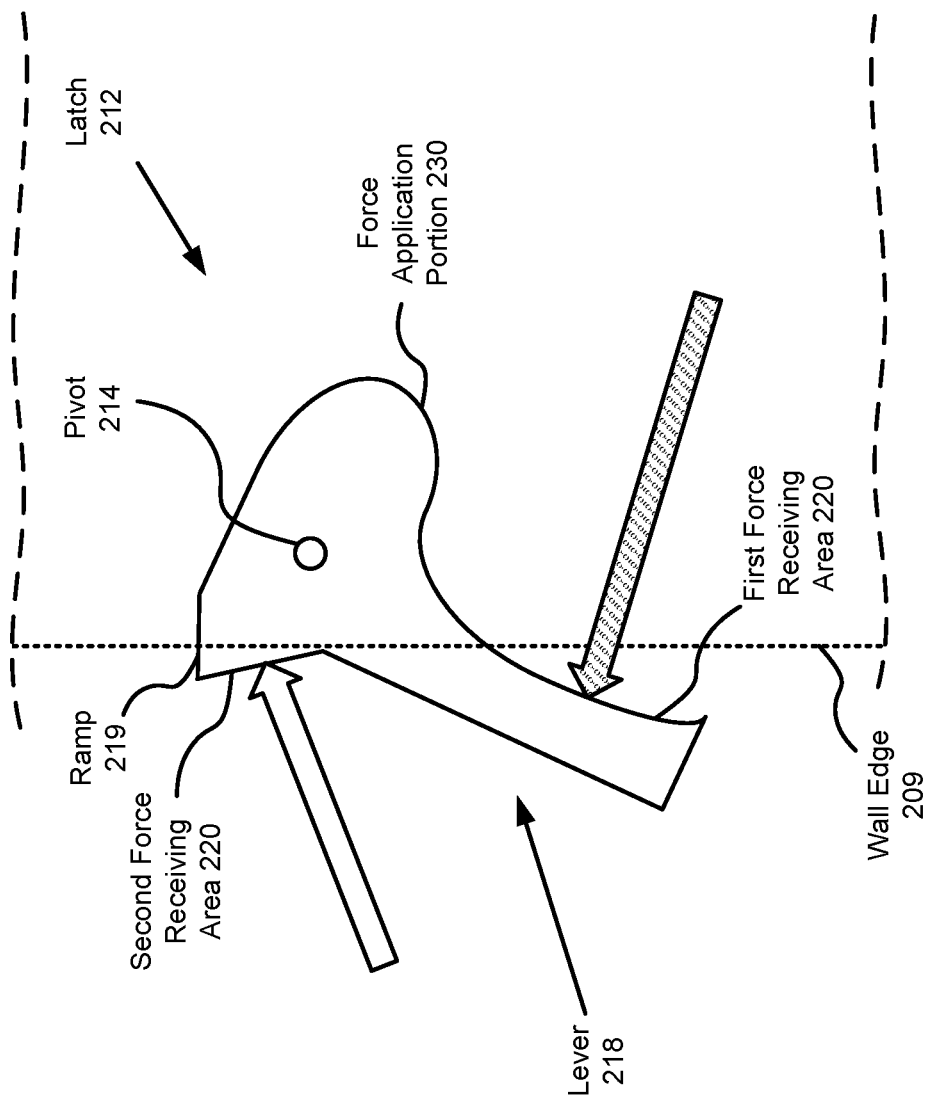
Figure 2F:
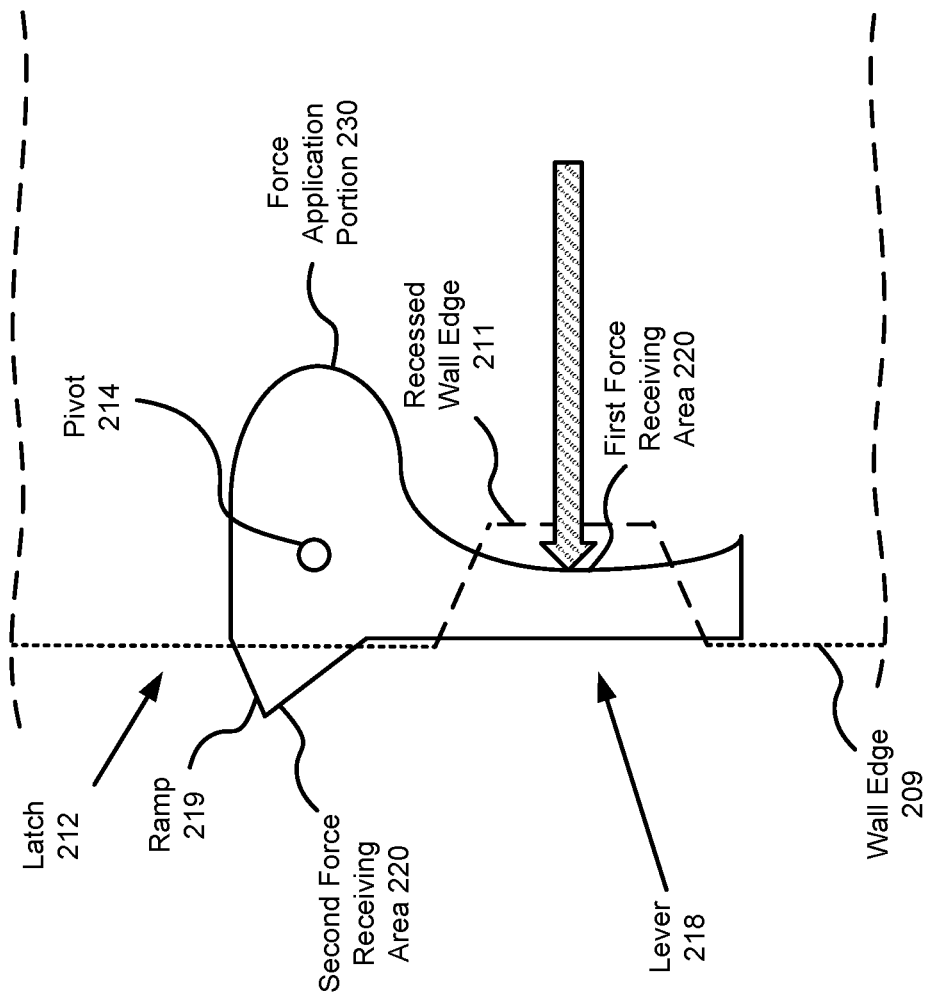
Figure 2G:
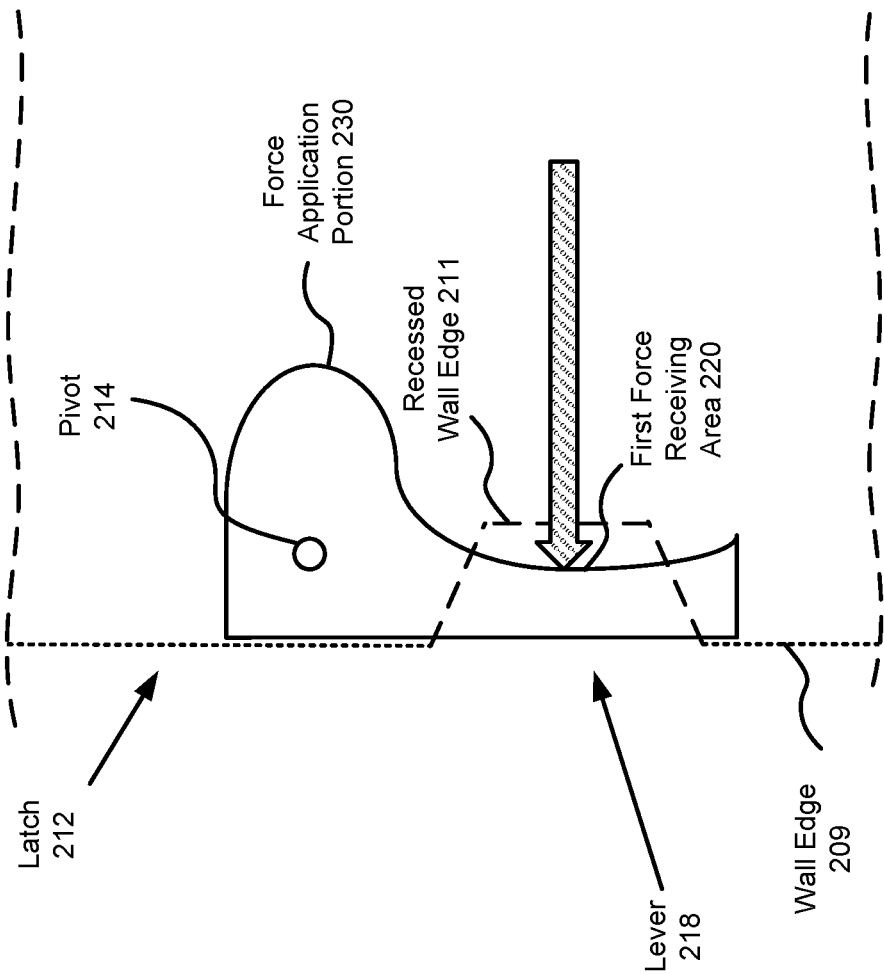
Figure 2H:
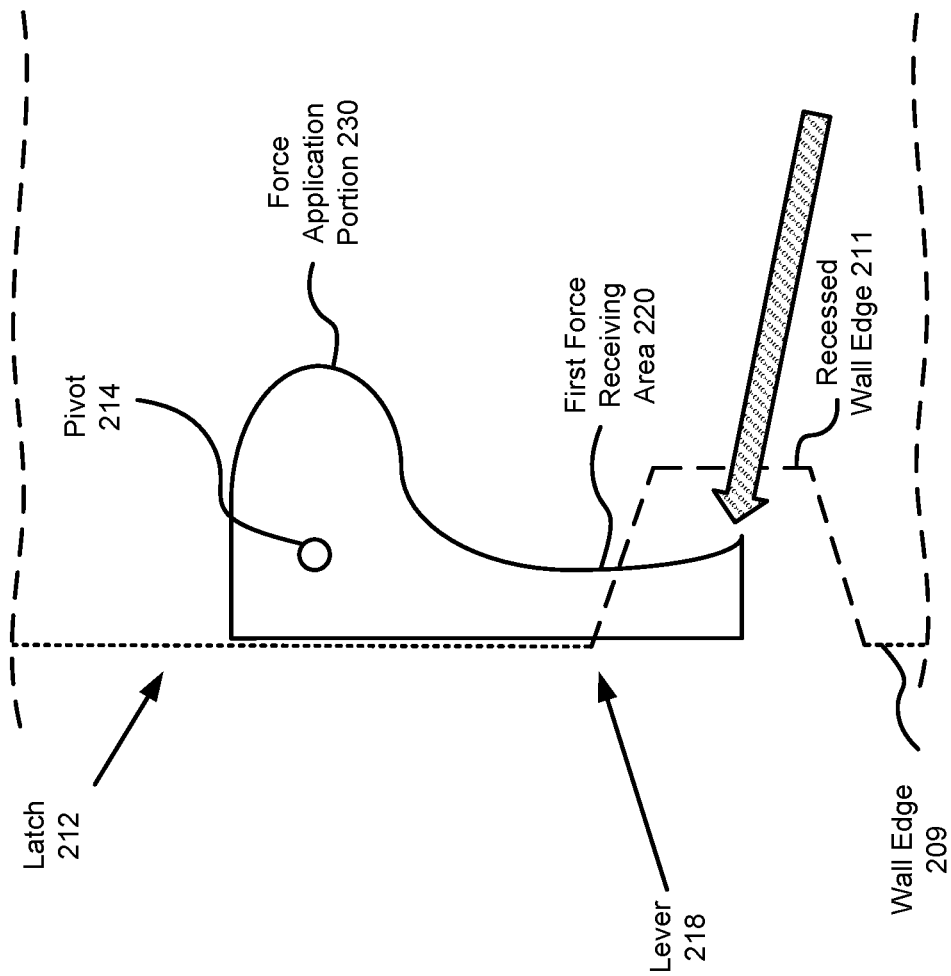
Figure 21:
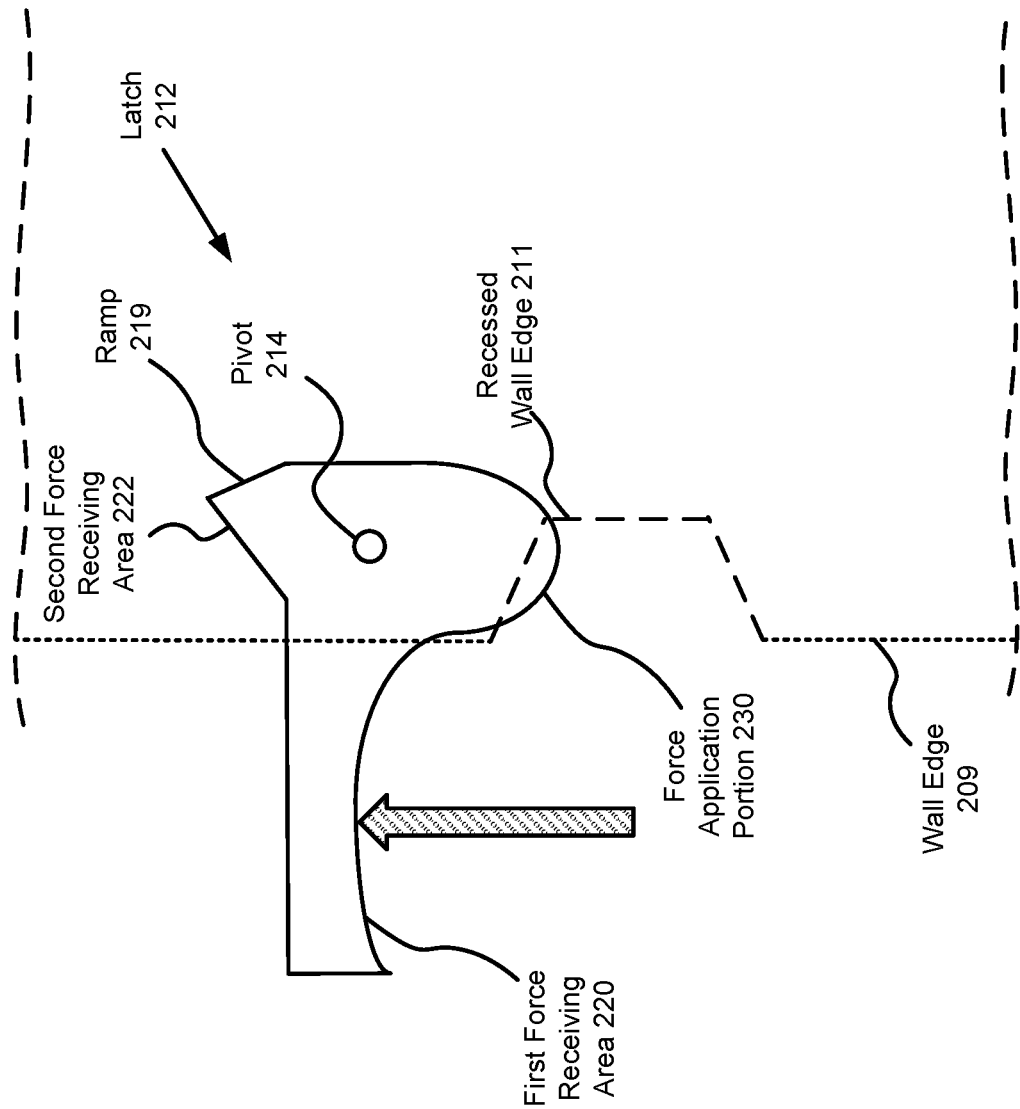
Figure 2J:
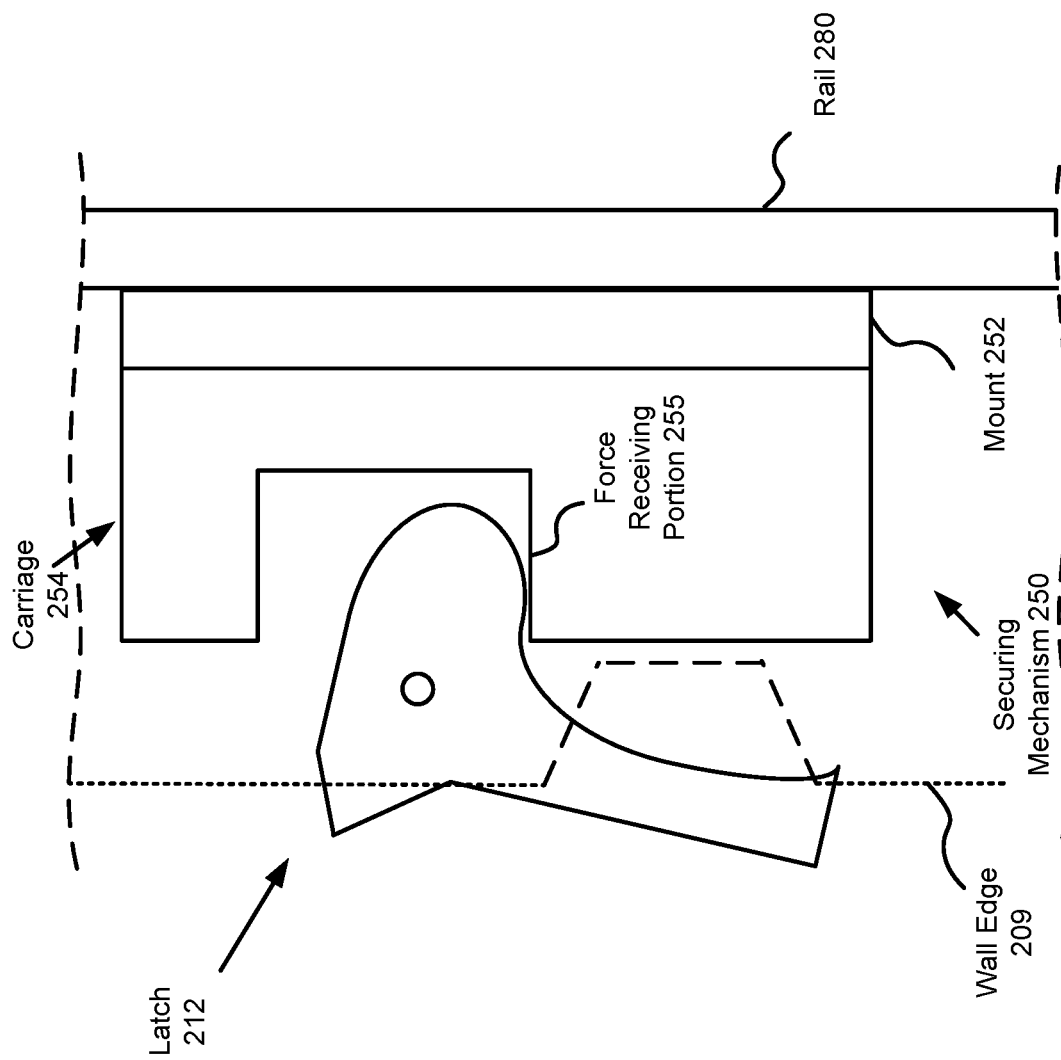
Figure 2K:
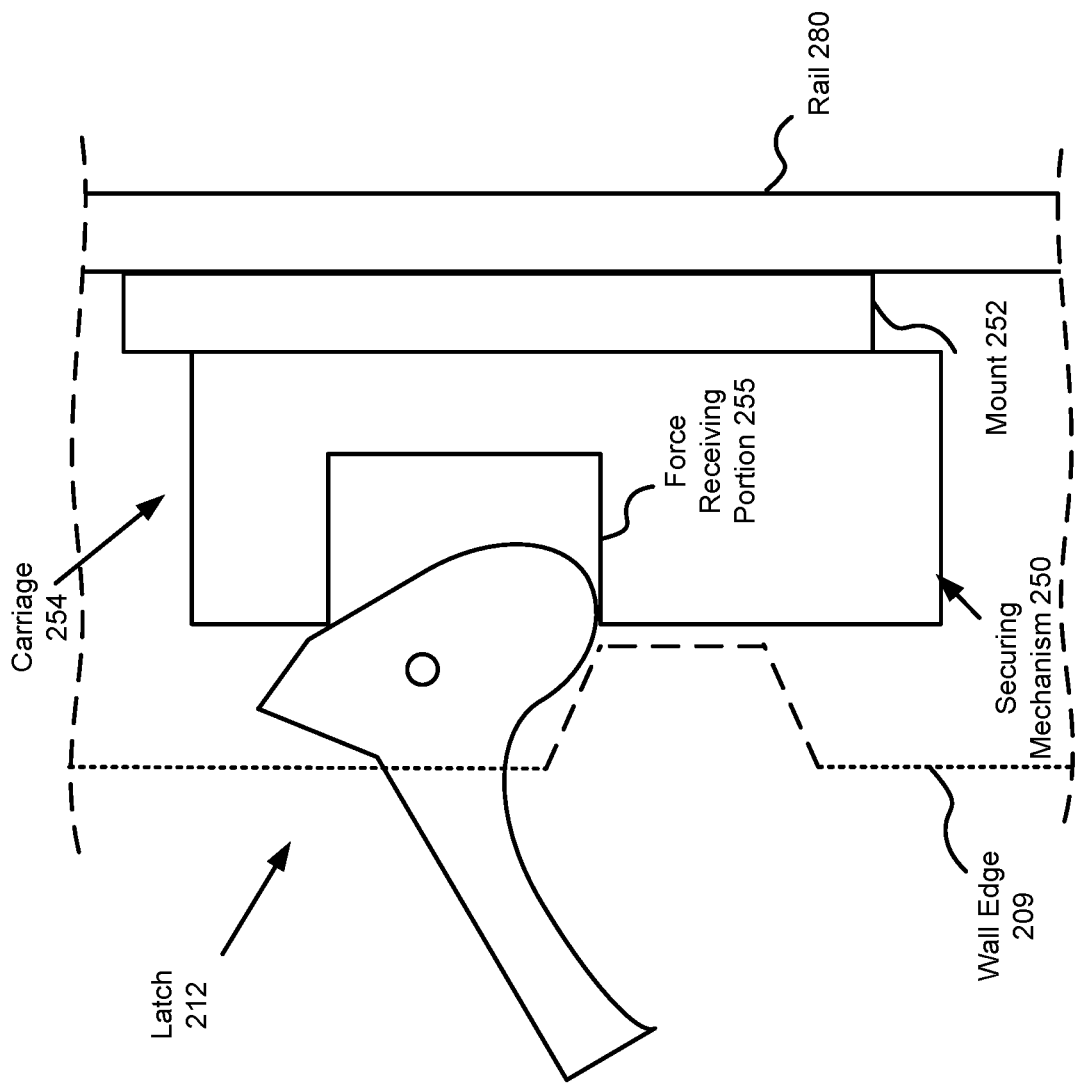
Figure 3:
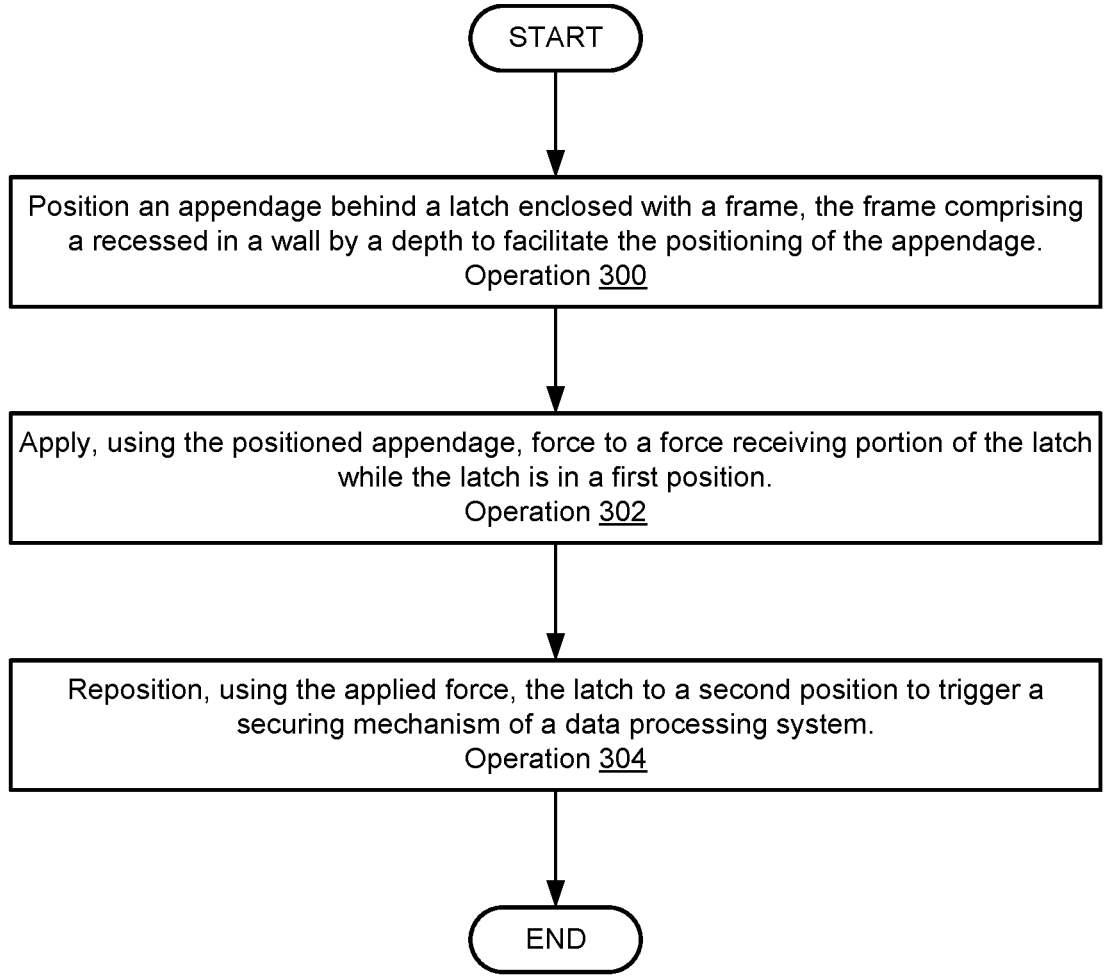
FIG. 3 shows a flow diagram illustrating a method of managing a chassis in accordance with an embodiment.

When providing its functionality, a data processing system in accordance with an embodiment may perform all, or a portion, of the actions and methods illustrated in FIGS. 2B-3.

A data processing system may be implemented using a computing device such as a host or a server, a personal computer (e.g., desktops, laptops, and tablets), a "thin" client, a personal digital assistant (PDA), a Web enabled appliance, a mobile phone (e.g., Smartphone), an embedded system, local controllers, an edge node, and/or any other type of data processing device or system. For additional details regarding computing devices, refer to FIG. 4.

While illustrated in FIGS. 1-2A as including a limited number of specific components, a data processing system in accordance with an embodiment may include fewer, additional, and/or different components than those illustrated therein.

Turning to FIG. 2B, a diagram of ear 202 in accordance with an embodiment is shown. Ear 202, as discussed above, may include an extension of a chassis to facilitate reversible attachment of the chassis to an attachment mechanism.

To enable such reversible attachment, latch assembly 210 may be positioned in the latch area of ear 202. Latch assembly 210 may include latch 212, frame 213, pivot 214, and wall 208. Each of these components of latch assembly 210 is discussed below.

Latch 212 may facilitate detachment of a chassis from a rail or other type of attachment mechanism of an electronic rack. Latch 212 may include a lever with one or more surfaces for application of force. Latch 212 may be at least partially enclosed by frame 213. Frame may include structural members (e.g., wall 208) that protect and/or enclose components within ear 202. However, some portions of latch 212 may be exposed from frame 213 to enable force to be applied to latch 212 to actuate it.

When force is applied to these force receiving surfaces, latch 212 may rotate between various positions. Rotation of latch 212 may cause other mechanisms positioned in the latch area to actuate. For example, latch 212 may include a force application portion 230 which may apply forces to these mechanisms through rotation of latch 212. Refer to FIGS. 2J-2K for additional details regarding force application portions and mechanisms that may be within the latch area.

However, by virtue of the limited size of the latch area, the width of latch 212 may be limited. Consequently, the force receiving surfaces may be more difficult to apply force to thereby limiting the amount of force a user may apply to these areas. Refer to FIGS. 2C-2K for additional details regarding latch 212.

To improve the amount of force that a user may apply to these force receiving surfaces, wall 208 may include a recess (e.g., 216) and/or other features. These features may increase a level of exposure of at least one of these force receiving areas.

By doing so, a person may more easily apply forces to latch 212, thereby allowing the person to more easily actuate various mechanisms coupled to latch 212.

To further clarify embodiments disclosed herein, side view diagrams of a latch assembly in accordance with embodiments are shown in FIGS. 2C-2K. In each of these, the wall that may otherwise hide various portions of the latch assembly are drawn only with dashed outlining. Additionally, only a portion of the assemblies are shown. Lines drawn with long dashing at the top and bottom of each sheet indicate that the structures may continue above and below the drawn portion of the assemblies.

Turning to FIG. 2C, a first side view diagram of a latch assembly in accordance with an embodiment is shown. The latch assembly may include latch 212. Latch 212 may include lever 218 and pivot 214.

Lever 218 may include a first force receiving area (e.g., 220) and a second force receiving area (e.g., 222). First force receiving area 220 may be an area on a back side of lever 218 (e.g., opposite from the side of latch 212 viewable from a front side of the chassis).

In contrast, second force receiving area 222 may be positioned on a front side of lever 218. Consequently, while latch 212 is at rest (e.g., no force applied to it, held in place by a return mechanism such as a spring) in a rest position as shown in FIG. 2C, the second force receiving area may be generally accessible while the first force receiving area 220 may be inaccessible.

For example, access to the first force receiving area may be blocked by walls on various sides of lever 218. In FIG. 2C, for example, wall edge 209 is shown. As seen in FIG. 2C, the wall edge may come up to and be substantially aligned with the top of lever 218. Thus, while in the rest position, only the top surface of lever 218 may be viewable and actuated.

To further facilitate application of force to second force receiving area 222, latch 212 may include ramp 219. Ramp 219 may include a protrusion from lever 218 on a front side of lever 218. The protrusion may raise second force receiving area 222 above wall edge 209. By doing so, a person may more easily apply force to second force receiving area 222 (e.g., using a thumb).

Lever 218 may be coupled to pivot 214. Pivot may be implemented using any type of pivot to facilitate rotation of lever 218 about pivot 214. Pivot 214 may be attached to walls and/or other structures positioned by lever 218.

To facilitate actuation of various mechanisms, latch 212 may include force application portion 230. Force application portion 230 may be portion of latch 212 having a shape adapted to apply force to various mechanisms through rotation of lever 218. For example, force application portion 230 may include a protrusion from lever 218 that may make physical contact with another mechanism to apply force to it. The force may actuate the mechanism. Refer to FIGS. 2D-2E for additional details regarding applying force to rotate lever 218. Refer to FIGS. 2J-2K for additional details regarding actuation of mechanisms by force application portion 230 through actuation of lever 218.

Turning to FIG. 2D, a second side view diagram of a latch assembly in accordance with an embodiment is shown. Continuing with the discussion from FIG. 2C, to rotate lever 218 a first force (e.g., shown with the oversized arrow with white infill) may be applies to second force receiving area 222. For example, a person's thumb may be aligned with and pressed against second force receiving area 222.

Turning to FIG. 2E, a third side view diagram of a latch assembly in accordance with an embodiment is shown. Continuing with the discussion from FIG. 2D, once the first force is applied, lever 218 may rotate from the rest position and to a second position, as depicted in FIG. 2D. While in the second position, first force receiving area 220 may be raised above wall edge 209 thereby allowing the person to hook a finger behind lever 218 to apply second force (e.g., shown with the second oversized arrow with lined infill) to first force receiving area 220. This second force may be used to further rotate lever 218 which may cause force application portion 230 to actuate various mechanisms.

Additionally, as seen in FIG. 2E, rotating lever 218 to the second position may cause it to be substantially withdrawn below wall edge 209. Consequently, it may not be possible to continue to rotate lever 21 through application of force to second force receiving area 220 (e.g., the wall may prevent access to second force receiving area 222).

However, the ability of lever 218 to reach the second position may be limited by the amount of force that may be applied to the second force receiving area. If the width of the lever and the second force receiving area is insufficient, then lever 218 may not sufficiently rotate to the second position thereby preventing access to the first force receiving area.

Turning to FIG. 2F, a fourth side view diagram of a latch assembly in accordance with an embodiment is shown. Continuing with the discussion from FIG. 2E, to facilitate application of force to first force receiving area, a recess may be positioned with the wall that bounds at least one side of lever 218.

For example, wall edge 209 may include a portion that is recessed back thereby including recessed wall edge 211 (drawn in longer dashing throughout the figures). As seen in FIG. 2F, the recess may expose at least a portion of first force receiving area 220. In FIG. 2F, for example, a person may hook a finger in from a side of lever 218 to apply the second force to first force receiving area 220.

In this manner, the second force may be applied without needing to apply any force to the second force receiving area. Thus, width limits on lever 218 as imposed by various nearby reserved areas may not impact the ability of lever 218 to actuate various mechanisms.

Turning to FIG. 2G, a fifth side view diagram of a latch assembly in accordance with an embodiment is shown. Continuing with the discussion from FIG. 2F, in such scenarios where recessed wall edge 211 is sufficiently deep to allow the second force to be applied to first force receiving area 220 while the lever is in the rest position, then the size of the ramp may be greatly reduced.

For example, as shown in FIG. 2G, the ramp may be reduced to zero height of protrusion. Consequently, when at rest, the top of lever 218 may be substantially aligned with wall edge 209. Accordingly, the person may not apply the first force to the second force receiving area at all, in this example scenario.

Turning to FIG. 2H, a sixth side view diagram of a latch assembly in accordance with an embodiment is shown. Continuing with the discussion from FIG. 2H, while drawn in FIG. 2F as being positioned along the length of lever 218, it will be appreciated that recessed wall edge 211 may be positioned with an end of lever 218. If so positioned, the user may hook their finger around the end of lever 218 apply the second force to lever 218 (e.g., which may be distributed in part over first force receiving area 220 and the end of lever 218.

Turning to FIG. 2I, a seventh side view diagram of a latch assembly in accordance with an embodiment is shown. Continuing with the discussion from FIG. 2I, once the second force is applied to the first force receiving area (e.g., via any of the processes discussed with respect to the prior figures), latch 212 may continue to rotate to a third position, as shown in FIG. 2I. During this rotation, force application portion 230 may apply force to various mechanism.

Turning to FIG. 2J, an eighth side view diagram of a latch assembly in accordance with an embodiment is shown. Continuing with the discussion from FIG. 2I, consider an example scenario where securing mechanism 250 is positioned behind latch 212 while force is applied to latch 212 moving it to the second position.

In this example scenario, the securing mechanism may reversibly secure the chassis to rail 280 (e.g., a portion of an electronic rack). To do so, securing mechanism 250 may include, for example, mount 252 and carriage 254.

Mount 252 may be a physical mount (e.g., a plate with holes) for carriage 254. For example, mount 252 may include fixation elements (e.g., bolts, hooks, etc.) to fixedly attach it to rail 280. Mount 252 may be coupled to carriage 254 via a slidable interface such that carriage 254 may slide with respect to mount 252 (e.g., up/down on the page).

Carriage 254 may reversibly attach the chassis to it. To do so, carriage 254 may also include fixation elements such as hooks (not shown) which may reversibly attach to corresponding elements on the chassis). However, sliding of carriage 254 up/down may detach the fixation elements such that the chassis may detach itself from securing mechanism 250. When so detached the chassis may slide out of the electronic rack.

To facilitate actuation of securing mechanism 250, carriage 254 may include force receiving portion 255 (e.g., a surface), which may receive forces from the force application portion of latch 212. For example, as seen in FIG. 2J, as latch 212 rotates, the force application portion of latch 212 begins to approach force receiving portion 255.

Turning to FIG. 2K, a ninth side view diagram of a latch assembly in accordance with an embodiment is shown. Continuing with the discussion from FIG. 2J, consider an example scenario where securing mechanism 250 is positioned behind latch 212 while force is applied to latch 212 moving it to the third position.

During movement from the second to the third position, the force application portion of latch 212 may apply pressure to force receiving portion 255. Consequently, force receiving portion 255 may drop thereby detaching the chassis from carriage 254.

While described and shown in FIGS. 2J-2K with respect to securing mechanism 250, it will be appreciated that other types of mechanisms and/or mechanisms performing similar functions but having different components may be used without departing from embodiments disclosed herein.

As discussed above, the components of FIG. 1 may perform various methods. FIG. 3 illustrates methods that may be performed with the components shown in FIGS. 1-2K. In the diagram discussed below and shown in FIG. 3, any of the operations may be repeated, performed in different orders, and/or performed in parallel with or in a partially overlapping in time manner with other operations.

Turning to FIG. 3, a flow diagram illustrating a method of actuating a mechanism in accordance with an embodiment is shown. The method may be performed, for example, with any of the device shown in FIG. 1 (e.g., data processing systems housed in chassis), various components of the devices, and/or other devices not shown in FIGS. 1-2K.

At operation 300, an appendage is positioned behind a latch enclosed with a frame. The appendage may be a finger of a technician or other person tasked with working on a data processing system. The frame may include a recess in a wall. The recess may be of a depth to facilitate the positioning of the appendage.

For example, the depth of the recess may expose a rear portion of a lever of the latch. To position the appendage, the person may hook a finger around a side or bottom of the latch using the recess for clearance.

At operation 302, force is applied to a force receiving portion of the latch while the latch is in a first position. The force may be applied by the appendage. For example, the person may pull the finger towards themselves which may apply force to the rear surface of the lever, which may include the force receiving portion.

This force may be applied without previously applying other forces to the latch. In other words, the first position may be an at rest position for the latch.

At operation 304, the latch is repositioned to a second position using the applied force. For example, the latch may rotate when the force is so applied. The rotation of the latch may cause the latch to apply force to a securing mechanism of a data processing system. The force may trigger the securing mechanism to release (e.g., detach) a chassis of the data processing system from a rail or other structure. Consequently, the chassis may be able to move (e.g., at least along a predefined path and without predefined limits long the path.

The method may end following operation 304.

Using the method shown in FIG. 3, a technician or other person may detach a chassis from a rail or other structure by application of a single force to a latch.

Figure 4:
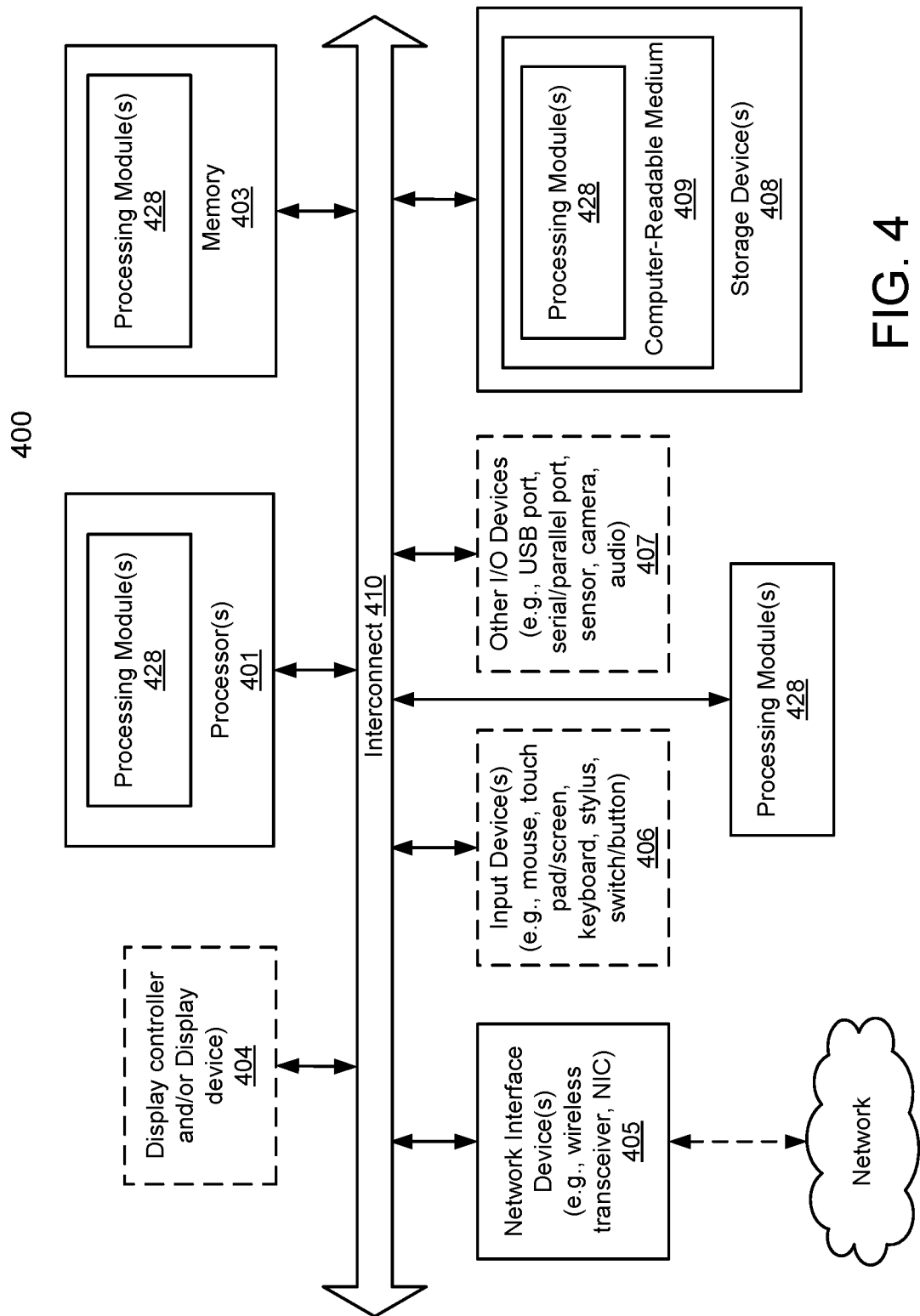
FIG. 4 shows a block diagram illustrating a data processing system in accordance with an embodiment.

Any of the components illustrated in FIGS. 1-2K may be implemented with one or more computing devices. Turning to FIG. 4, a block diagram illustrating an example of a data processing system (e.g., a computing device) in accordance with an embodiment is shown. For example, system 400 may represent any of data processing systems described above performing any of the processes or methods described above, and may include the illustrated components as well as any of the other components discussed with respect to FIGS. 1-2G. System 400 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 400 is intended to show a high-level view of many components of the computer system. However, it is to be understood that additional components may be present in certain implementations and furthermore, different arrangement of the components shown may occur in other implementations. System 400 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 400 includes processor 401, memory 403, and devices 405-407 via a bus or an interconnect 410. Processor 401 may represent a single processor or multiple processors with a single processor core or multiple processor cores included therein. Processor 401 may represent one or more general-purpose processors such as a microprocessor, a central processing unit (CPU), or the like. More particularly, processor 401 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 401 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 401, which may be a low power multi-core processor socket such as an ultra-low voltage processor, may act as a main processing unit and central hub for communication with the various components of the system. Such processor can be implemented as a system on chip (SoC). Processor 401 is configured to execute instructions for performing the operations discussed herein. System 400 may further include a graphics interface that communicates with optional graphics subsystem 404, which may include a display controller, a graphics processor, and/or a display device.

Processor 401 may communicate with memory 403, which in one embodiment can be implemented via multiple memory devices to provide for a given amount of system memory. Memory 403 may include one or more volatile storage (or memory) devices such as random-access memory (RAM), dynamic RAM (DRAM), synchronous DRAM (SDRAM), static RAM (SRAM), or other types of storage devices. Memory 403 may store information including sequences of instructions that are executed by processor 401, or any other device. For example, executable code and/or data of a variety of operating systems, device drivers, firmware (e.g., input output basic system or BIOS), and/or applications can be loaded in memory 403 and executed by processor 401. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

System 400 may further include IO devices such as devices (e.g., 405, 406, 407, 408) including network interface device(s) 405, optional input device(s) 406, and other optional IO device(s) 407. Network interface device(s) 405 may include a wireless transceiver and/or a network interface card (NIC). The wireless transceiver may be a Wi-Fi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 406 may include a mouse, a touch pad, a touch sensitive screen (which may be integrated with a display device of optional graphics subsystem 404), a pointer device such as a stylus, and/or a keyboard (e.g., physical keyboard or a virtual keyboard displayed as part of a touch sensitive screen). For example, input device(s) 406 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 407 may include an audio device. An audio device may include a speaker and/or a microphone to facilitate voice-enabled functions, such as voice recognition, voice replication, digital recording, and/or telephony functions. Other IO devices 407 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. IO device(s) 407 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 410 via a sensor hub (not shown), while other devices such as a keyboard or thermal sensor may be controlled by an embedded controller (not shown), dependent upon the specific configuration or design of system 400.

To provide for persistent storage of information such as data, applications, one or more operating systems and so forth, a mass storage (not shown) may also couple to processor 401. In various embodiments, to enable a thinner and lighter system design as well as to improve system responsiveness, this mass storage may be implemented via a solid state device (SSD). However, in other embodiments, the mass storage may primarily be implemented using a hard disk drive (HDD) with a smaller amount of SSD storage to act as an SSD cache to enable non-volatile storage of context state and other such information during power down events so that a fast power up can occur on re-initiation of system activities. Also, a flash device may be coupled to processor 401, e.g., via a serial peripheral interface (SPI). This flash device may provide for non-volatile storage of system software, including a basic input/output software (BIOS) as well as other firmware of the system.

Storage device 408 may include computer-readable storage medium 409 (also known as a machine-readable storage medium or a computer-readable medium) on which is stored one or more sets of instructions or software (e.g., processing module, unit, and/or processing module/unit/logic 428) embodying any one or more of the methodologies or functions described herein. Processing module/unit/logic 428 may represent any of the components described above. Processing module/unit/logic 428 may also reside, completely or at least partially, within memory 403 and/or within processor 401 during execution thereof by system 400, memory 403 and processor 401 also constituting machine-accessible storage media. Processing module/unit/logic 428 may further be transmitted or received over a network via network interface device(s) 405.

Computer-readable storage medium 409 may also be used to store some software functionalities described above persistently. While computer-readable storage medium 409 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of embodiments disclosed herein. The term "computer-readable storage medium" shall accordingly be taken to include, but not be limited to, solid-state memories, and optical and magnetic media, or any other non-transitory machine-readable medium.

Processing module/unit/logic 428, components and other features described herein can be implemented as discrete hardware components or integrated in the functionality of hardware components such as ASICS, FPGAs, DSPs, or similar devices. In addition, processing module/unit/logic 428 can be implemented as firmware or functional circuitry within hardware devices. Further, processing module/unit/logic 428 can be implemented in any combination hardware devices and software components.

Note that while system 400 is illustrated with various components of a data processing system, it is not intended to represent any particular architecture or manner of interconnecting the components; as such details are not germane to embodiments disclosed herein. It will also be appreciated that network computers, handheld computers, mobile phones, servers, and/or other data processing systems which have fewer components or perhaps more components may also be used with embodiments disclosed herein.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments disclosed herein also relate to an apparatus for performing the operations herein. Such a computer program is stored in a non-transitory computer readable medium. A non-transitory machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments disclosed herein are not described with reference to any particular programming language. It will be appreciated that a variety of programming languages may be used to implement the teachings of embodiments disclosed herein.

In the foregoing specification, embodiments have been described with reference to specific exemplary embodiments thereof. It will be evident that various modifications may be made thereto without departing from the broader spirit and scope of the embodiments disclosed herein as set forth in the following claims. The specification and drawings are, accordingly, to be regarded in an illustrative sense rather than a restrictive sense.

What is claimed is:

1. A data processing system, comprising
   a chassis to house hardware components;
   an ear of the chassis, the ear of the chassis comprising:
     a reserved area, and
     a latch area;
   a latch assembly, comprising:
     a latch positioned in the latch area and coupled to a securing mechanism that facilitates reversible attachment of the chassis to a rail system, the latch comprising:

a force receiving portion, and
a force application portion to selectively drive the securing mechanism; and
a frame that restricts physical access to the latch, the frame comprising:
a wall positioned to restrict access to at least a portion of the latch, and
a recess positioned in the wall that exposes the force receiving portion while the latch is in an at rest position.

2. The data processing system of claim 1, wherein the latch further comprises:
an additional force receiving portion that is not enclosed by the frame while the latch is in the at rest position.

3. The data processing system of claim 2, wherein the additional force receiving portion comprises a ramp.

4. The data processing system of claim 3, further comprising a pivot coupled to the latch, the pivot causing the latch to rotate from the at rest position to a second position while force is applied to the force receiving portion and to rotate from the second position to a third position while second force is applied to the additional force receiving portion.

5. The data processing system of claim 4, wherein, while in the second position, the force receiving portion is further exposed when compared to a level of exposure while in the at rest position, and the further exposure of the force receiving portion facilitate a higher level of force application to the force receiving portion when compared to a level of force application facilitated by the level of exposure while in the at rest position.

6. The data processing system of claim 1, wherein the latch further comprises:
a pivot; and
a lever coupled to the pivot to cause the lever to rotate about the pivot while a force is applied to the force application portion.

7. The data processing system of claim 6, wherein the wall comprises:
an edge aligned, while the latch is in the at rest position, with at least a portion of the lever to restrict physical access to the at least the portion of the lever.

8. The data processing system of claim 7, wherein when lever is rotated to move the latch to a second position, the at least the portion of the lever moves with respect to the wall exposing the at least the portion of the lever.

9. The data processing system of claim 6, wherein the wall is parallel to a plane in which the lever moves while the lever is rotated.

10. The data processing system of claim 1, wherein while in the at rest position, a top of the latch is substantially aligned with a front side of the chassis, the front side of the chassis being bound by at least four walls, and edges of the walls being in a plane to which the top of the latch is substantially aligned.

11. A chassis, comprising:
an ear comprising:
a reserved area, and
a latch area;
a latch assembly, comprising:
a latch positioned in the latch area and coupled to a securing mechanism that facilitates reversible attachment of the chassis to a rail system, the latch comprising:
a force receiving portion, and
a force application portion to selectively drive the securing mechanism; and
a frame that restricts physical access to the latch, the frame comprising:
a wall positioned to restrict access to at least a portion of the latch, and
a recess positioned in the wall that exposes the force receiving portion while the latch is in an at rest position.

12. The chassis of claim 11, wherein the latch further comprises:
an additional force receiving portion that is not enclosed by the frame while the latch is in the at rest position.

13. The chassis of claim 12, wherein the additional force receiving portion comprises a ramp.

14. The chassis of claim 13, further comprising a pivot coupled to the latch, the pivot causing the latch to rotate from the at rest position to a second position while force is applied to the force receiving portion and to rotate from the second position to a third position while second force is applied to the additional force receiving portion.

15. The chassis of claim 14, wherein, while in the second position, the force receiving portion is further exposed when compared to a level of exposure while in the at rest position, and the further exposure of the force receiving portion facilitate a higher level of force application to the force receiving portion when compared to a level of force application facilitated by the level of exposure while in the at rest position.

16. The chassis of claim 11, wherein the latch further comprises:
a pivot; and
a lever coupled to the pivot to cause the lever to rotate about the pivot while a force is applied to the force application portion.

17. The chassis of claim 16, wherein the wall comprises:
an edge aligned, while the latch is in the at rest position, with at least a portion of the lever to restrict physical access to the at least the portion of the lever.

18. The chassis of claim 17, wherein when lever is rotated to move the latch to a second position, the at least the portion of the lever moves with respect to the wall exposing the at least the portion of the lever.

19. The chassis of claim 16, wherein the wall is parallel to a plane in which the lever moves while the lever is rotated.

20. A latch assembly, comprising:
a latch for positioning in a latch area of a chassis, the latch being coupled to a securing mechanism that facilitates reversible attachment of a chassis to a rail system, the latch comprising:
a force receiving portion, and
a force application portion to selectively drive the securing mechanism; and
a frame that restricts physical access to the latch, the frame comprising:
a wall positioned to restrict access to at least a portion of the latch, and
a recess positioned in the wall that exposes the force receiving portion while the latch is in an at rest position.

* * * * *